United States Patent
Maqbool

(10) Patent No.: US 12,224,714 B1
(45) Date of Patent: Feb. 11, 2025

(54) MULTIPLE TRANSISTOR LOW NOISE AMPLIFIER OPTIMIZED FOR CRYOGENIC TEMPERATURES

(71) Applicant: AmpliTech, Inc., Bohemia, NY (US)

(72) Inventor: Fawad Maqbool, Bohemia, NY (US)

(73) Assignee: AmpliTech, Inc., Bohemia, NY (US)

( * ) Notice: Subject to any disclaimer, the term of this patent is extended or adjusted under 35 U.S.C. 154(b) by 361 days.

(21) Appl. No.: 17/322,517

(22) Filed: May 17, 2021

Related U.S. Application Data

(60) Provisional application No. 63/025,811, filed on May 15, 2020.

(51) Int. Cl.
| | |
|---|---|
| *H03F 3/68* | (2006.01) |
| *H03F 1/22* | (2006.01) |
| *H03F 1/30* | (2006.01) |
| *H03F 1/56* | (2006.01) |
| *H03F 3/19* | (2006.01) |
| *H03F 3/21* | (2006.01) |

(52) U.S. Cl.
CPC ............ *H03F 1/301* (2013.01); *H03F 1/223* (2013.01); *H03F 1/565* (2013.01); *H03F 3/19* (2013.01); *H03F 3/211* (2013.01); *H03F 2200/294* (2013.01); *H03F 2200/372* (2013.01)

(58) Field of Classification Search
CPC .......... H03F 1/301; H03F 1/223; H03F 1/565; H03F 2200/294; H03F 2200/372; F25B 9/14
See application file for complete search history.

(56) References Cited

U.S. PATENT DOCUMENTS

| | | | |
|---|---|---|---|
| 5,717,608 A | 2/1998 | Jensen | |
| 6,323,426 B1 * | 11/2001 | Hoshizaki | H10N 60/81 |
| | | | 257/726 |
| 6,622,028 B1 | 9/2003 | Abdelmonem et al. | |
| 6,963,758 B2 * | 11/2005 | Narahashi | H04B 7/0491 |
| | | | 455/562.1 |
| 7,266,360 B2 | 9/2007 | Kang et al. | |
| 7,583,150 B2 | 9/2009 | Buer et al. | |

(Continued)

OTHER PUBLICATIONS

U.S. Appl. No. 17/322,448, filed May 17, 2021, Fawad Maqbool, Multiple Transistor LNA MMIC Design.

(Continued)

*Primary Examiner* — Khanh V Nguyen
(74) *Attorney, Agent, or Firm* — Polsinelli LLP

(57) ABSTRACT

The present disclosure is directed to apparatus and method that extends a useful operation range of an amplifier circuit. Here a low noise amplifier may be attached to a cold end of a cooler or chiller, such as a "Stirling" cryocooler after which a chamber that encloses the cold end of the cooler and the amplifier may be assembled. Gas included in the chamber may be removed by attaching an input to a vacuum pump to a portion of the chamber. After the chamber is sealed such that a low pressure in the chamber can be maintained, the cooler may be turned on in order to chill the amplifier to temperatures that reduce noise generated internally to the amplifier or to reduce amounts of return loss associated with the amplifier. The use of a Stirling cryocooler allows for the amplifier to be cooled to very low or cryogenic temperatures.

21 Claims, 10 Drawing Sheets

(56) References Cited

U.S. PATENT DOCUMENTS

| | | | |
|---|---|---|---|
| 7,616,061 B2* | 11/2009 | Cha | H03F 3/345 |
| | | | 330/126 |
| 7,705,676 B2 | 4/2010 | Kirchmeier et al. | |
| 7,795,965 B2* | 9/2010 | Suzuki | H03F 3/193 |
| | | | 330/289 |
| 8,786,369 B2 | 7/2014 | Takagi | |
| 9,397,134 B1 | 7/2016 | Lewkow | |
| 11,008,115 B2 | 5/2021 | Wozniak | |
| 2013/0003373 A1 | 1/2013 | Hamby | |
| 2017/0077580 A1* | 3/2017 | Kawaguchi | G01S 7/02 |
| 2017/0205281 A1 | 7/2017 | Cassainge | |
| 2018/0327106 A1 | 11/2018 | Wozniak | |

OTHER PUBLICATIONS

U.S. Appl. No. 17/322,653, filed May 17, 2021, Fawad Maqbool, Low Noise Amplifiers/Front-Ends Optimized for Use in 5G Networks.
U.S. Appl. No. 17/322,448 Office Action mailed Apr. 13, 2023.
U.S. Appl. No. 17/322,653 Office Action mailed Nov. 13, 2023.
U.S. Appl. No. 17/322,448 Final Office Action mailed Sep. 28, 2023.
U.S. Appl. No. 17/322,653 Final Office Action mailed Mar. 6, 2024.

* cited by examiner

MULTIPLE TRANSISTOR LOW NOISE AMPLIFIER OPTIMIZED FOR CRYOGENIC TEMPERATURES

CROSS-REFERENCE TO RELATED APPLICATIONS

This application claims priority benefit of U.S. provisional patent application Ser. No. 63/025,811 filed on May 15, 2020, the disclosure of which is incorporated herein by reference.

BACKGROUND OF THE INVENTION

Field of the Invention

The present disclosure is generally related to low noise amplifiers. More specifically, the present disclosure is directed to packaging that improves operation of low noise amplifiers.

Description of the Related Art

An electrical or electronic amplifier is a device that increases the voltage, current, or power of an input signal. One example of an amplifier is an audio amplifier that receives a low voltage electrical signal and that outputs an electrical signal at an increased voltage as compared to the input signal. This output signal may be provided to a speaker such that sounds may be heard by a person. Amplifiers commonly increase both the voltage, current, or power of an input signal such that information included in the signal may be used. "Gain" is a term that refers to a ratio of an output signal to an input signal of an amplifier. This term, gain, was originally used in reference to vacuum tube amplifiers in the 1940s and is now used in reference to transistor circuits. Transistors are fabricated using semi-conductive materials arranged in various configurations. Examples of different types of transistors include bipolar transistors, field-effect transistors (FETS), metal-semiconductor field-effect transistors (MESFETS), and metal-oxide-semiconductors field-effect transistors (MOSFETS). Other electronic devices that produce gain or may be arranged to form amplifier circuits include components such as tunnel diodes.

When applied properly, an amplifying circuit provides enough gain to serve a useful purpose without exacerbating negative side effects that can be encountered when a gain of a circuit is increased beyond a threshold level. Negative side effects that can be encountered in an amplifier include signal distortion, increased noise, and a reduced signal to noise ratio. Signal distortion, such as harmonic distortion or nonlinear mixing can result in changing characteristics or shape of a signal to a point where the signal is not useful for its intended purpose. The term noise is used in electronic circuits to refer to anomalous electronic signals or disturbances that can add to or detract from a signal. When a level of electrical or electronic noise is above a threshold level as compared to a level of an electrical or electronic signal, characteristics of that signal may be lost. Simply put if background noise is too great as compared to the strength of a signal, the signal may not be discernable. As such, the effects of signal distortion and reduced signal to noise ratio individually or when combined may cause an amplifier not to function properly for an intended use.

A "Low Noise Amplifier" (LNA) is an electronic amplifier that amplifies a very low-power or a low-level signal without significantly impacting its signal-to-noise ratio. Commonly, a low noise amplifier increases both the power of a signal and noise present at an input of the amplifier. A low noise amplifier circuit may also introduce additional electrical noise that was not present at the input of the amplifier. LNAs are found in in many market applications, such as radio communications systems, medical instruments, and electronic test equipment. A typical LNA can supply a power gain of 100 (20 decibels (dB)) while decreasing the signal-to-noise ratio by less than a factor of two (a 3 dB noise figure (NF)). Although LNAs are primarily concerned with optimizing weak signals that are just above a noise level, LNA designers must also consider the presence of larger signals that may cause an amplifier to change or distort a signal.

LNAs are used in communications receivers such as in cellular telephones, GPS receivers, wireless LANs (Wi-Fi), and satellite communications. In satellite communications systems, a ground station receiving antenna is coupled to an LNA to amplify weak received signals such that data may be extracted from that signal. Satellite signals commonly are weak because of factors that include distance or limited available power to transmit a signal from a satellite, for example. Since the strength of a transmitted signal reduces geometrically by distance, the farther away a received is from a transmitter, the weaker a received signal will be. Satellites in low earth orbit commonly transmit signals to receivers that are over 200 km (120 miles) away from the transmitter, satellites in a geosynchronous orbit transmit signals that are at least 35,786 km (22,236 miles) away from a receiver. This means that an LNA must amplify signals received by an antenna to increase the power of that signal such that data may be extracted from the signal.

Electrical noise may also come from various sources that include inherent background radiation, manmade or natural electromagnetic disturbances, atmospheric conditions, the presence of obstacles between a transmitter and receiver, or noise may be generated by components included in an amplification circuit. Manmade electrical noise may come from electrical or electronic devices as those devices function or as they are turned on or off.

LNAs are becoming increasingly popular for enhancing the performance of software-defined radio (SDR) receiver systems. SDRs are typically designed to be general purpose use, where amounts of noise associated with a signal may not be optimal for any one particular application. With a LNA and appropriate electrical or electronic filters, the sensitivity and performance of a receiver can be greatly enhanced.

Reducing extraneous electrical noise in a low noise amplifier is essential to producing a low noise amplifier suitable for highly sensitive applications. This is challenging due to the numerous variable factors which can contribute to increasing electrical noise. Even the shape of features of a circuit or a gate of a transistor, a capacitor, or a resistor may affect an amount of noise induced into a signal from an amplifying circuit.

Conventional approaches to reducing noise in an amplifier include following certain design rules or performing simulations, or tuning the amplifier. These conventional approaches, however have significant limitations. For example, design rules may not consider factors associated with a particular type of transmission, or simulations may not accurately model real world conditions or circumstances.

In some instances, simulation software may indicate that the design is not possible, despite the contrary being true. This is because the current software simulation models may not include many capacitances, inductances, or resistances that may be associated with the shapes of electronic components (e.g. transistors, resistors, or capacitors), distances between components, wiring that electrically connects those components, or other factors associated with an amplifier (e.g. number of circuit layers, insulation, or electrical grounds).

A highly sensitive low noise amplifier is essential in applications ranging from scientific research, to cryptographic transmission, wireless and satellite communications, and high definition audio systems. In these applications, traditional low noise amplifiers may either amplify received or induced noise. Even filters that are designed to filter out unwanted noise may not be as effective as desired or required.

Problems with the present technology include an inability to adequately mitigate noise and an inability to provide a consistent (i.e. an even or flat) gain over a range of frequencies. Other problems that present low noise amplifiers suffer from include unacceptable levels of signal distortion, additive noise, and excessive Johnson (thermal) noise.

What are needed are new design techniques and new amplifier circuits that reduce noise or that increase a signal to noise ratio in a manner that is suited for particular applications. What are also needed are new methods and apparatus for packaging amplifiers in ways that improve operating characteristics of those amplifiers.

SUMMARY OF THE PRESENTLY CLAIMED INVENTION

The presently claimed invention is directed to apparatus that cools amplifier circuits and to methods for making such apparatus. In one embodiment the apparatus includes a cold portion of a cooling device, an amplifier circuit assembly that is physically connected to the cold portion of the cooling device, and a chamber that contains the cold portion of the cooling device and the amplifier circuit assembly after the assembly has been physically connected to the cold portion of the cooling device.

In another embodiment, a method for packing an amplifier circuit may include physically attaching the amplifier circuit to a cold end of a cooling device, and attaching a first portion of a chamber to a second portion of the chamber such that the such that the cold end of the cooling device and the amplifier circuit are contained within the chamber after the first portion and the second portion of the chamber are attached. This method may also include reducing a pressure inside the chamber to a target pressure by removing gas from the chamber.

BRIEF DESCRIPTIONS OF THE DRAWINGS

DETAILED DESCRIPTION

Figure 1:
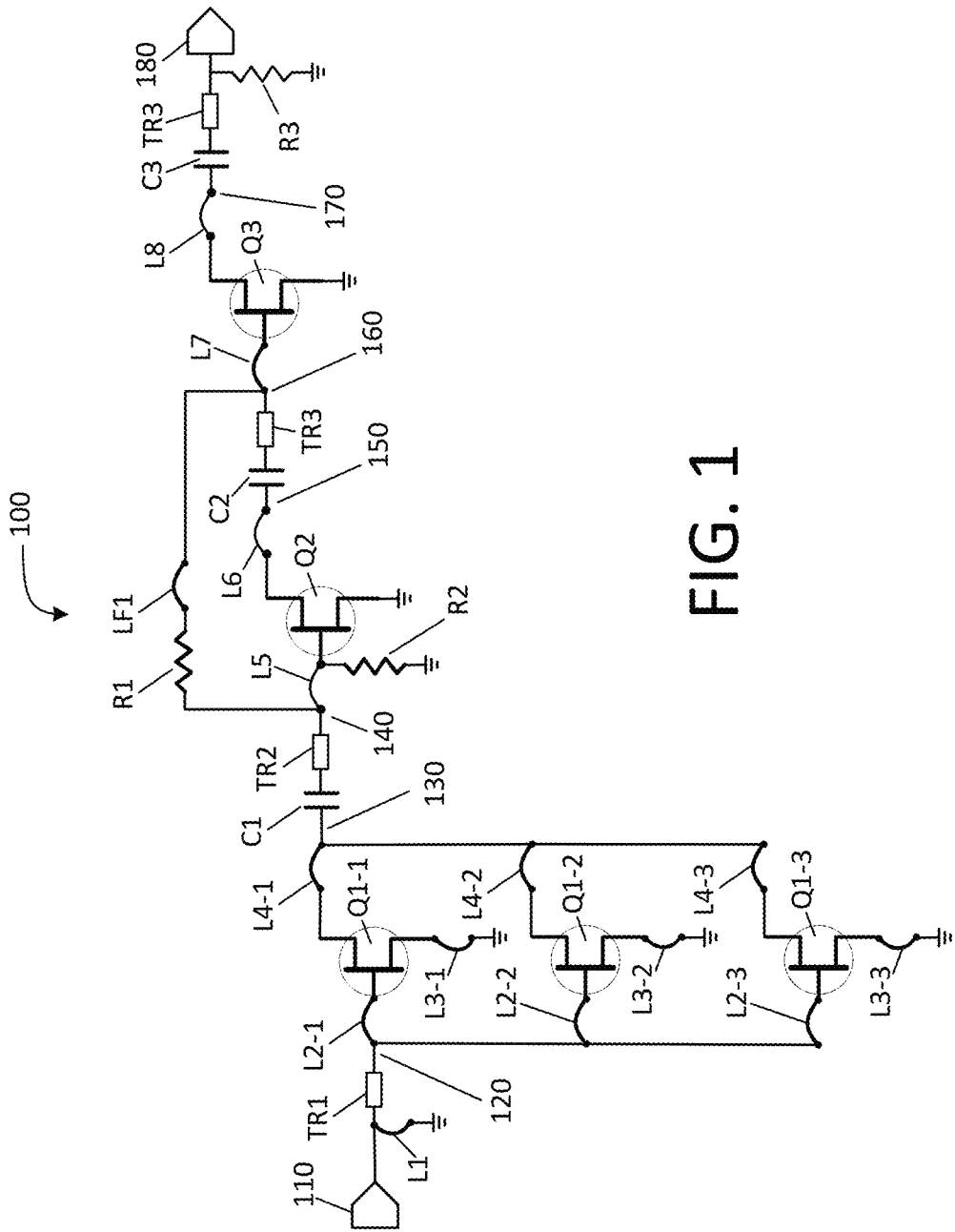
FIG. 1 illustrates circuits of a three-stage amplifier that includes a set of field effect transistors connected in a parallel configuration.

The present disclosure is directed to apparatus and method that extends a useful operation range of an amplifier circuit. Here a low noise amplifier may be attached to a cold end of a cooler or chiller, such as a "Stirling" cryocooler after which a chamber that encloses the cold end of the cooler and the amplifier may be assembled. Gas included in the chamber may be removed by attaching an input to a vacuum pump to a portion of the chamber. After the chamber is sealed such that a low pressure in the chamber can be maintained, the cooler may be turned on in order to chill the amplifier to temperatures that reduce noise generated internally to the amplifier or to reduce amounts of return loss associated with the amplifier. The use of a Stirling cryocooler allows for the amplifier to be cooled to very low temperatures, such as temperatures that are referred to as "cryogenic temperatures."

After a pressure inside of the chamber reaches a target pressure, the vacuum chamber may be sealed after which the vacuum pump may be removed. This process may include attaching the vacuum pump to a valve that is opened to allow the vacuum pump to suck gas out of the chamber. That valve may be sealed by closing the valve or by allowing the valve to close automatically based on removal of the vacuum pump from the valve. Alternatively, the vacuum pump may be attached to a hole in the chamber or a tube that protrudes out of the chamber. Here again after a pressure inside of the chamber reaches a target pressure the hole or tube may be sealed and the vacuum pump removed.

The chamber may include multiple parts that may be attached and sealed with a one or more seals disposed between respective parts. The chamber may also have sealed electrical interconnects or waveguides that attach to components external and internal to the chamber. These seals may be placed between surfaces where the electrical interconnect or waveguides meet a surface of the chamber. The various seals used in such an apparatus may be rated for use a low pressures and temperatures. Low pressures inside of the chamber may approach a nearly complete vacuum or may be an order of magnitude below Earth atmospheric pressure for example.

The present disclosure is directed to low noise amplifiers built within a case designed to cool components of an amplifier to temperatures that help prevent electrical noise from being generated by electronic components included in the amplifier. The present disclosure is also directed to low noise amplifiers that use both field effect transistors (FETs) in a parallel configuration and cold temperatures to help prevent electrical noise from being generated by electronic components included in the amplifier. Apparatus and methods of the present disclosure may combine amplifier circuits built within virtually any type of electronic assembly/package including, yet not limited to a circuit board, a quad flat pack, a ball grid array, multi-chip module, a monolithic millimeter or microwave integrated circuit (MMIC), or an integrated circuit that may include wire bonds.

The case could include standard electronic connectors, for example a sealed Bayonet-Neill-Concelman (BNC) or other connectors integrated into the case. One connector could be coupled to an input signal source (e.g. an antenna, waveguide, or other) and another connector could be coupled to an output that provides amplified signals to other equipment of components of a communication system.

Amplifiers of the present disclosure may include an amplification stage with two or more field effect transistors (FETS) connected in a parallel configuration. Such an amplifier may include two, three, or more amplification stages. Amplifiers consistent with the present disclosure may operate at frequencies in the range of 3 gigahertz (GHz) to 9 GHz or even higher frequencies in certain applications. Each transistor or amplification stage may include their own series feedback element. A second amplification stage may include two parallel transistors, with one having a series feedback element and a feedback shunt spanning the second stage. A third stage may include a single transistor. Each of the transistors connected in a parallel configuration may be tuned to a different corner frequency in order to improve metrics of noise figure, gain, input return loss, and output return loss not possible with conventional amplifier designs.

Techniques used to design a low noise amplifier (LNA) include modifying metallization shapes of wiring or components included in an amplifier, adjusting positions or orientations of amplifier components, changing the physical sizes of components, selecting low-noise components or high performance materials, optimizing circuit operating points, adjusting circuit topologies or layouts, adjusting stray inductance or capacitance, and impedance matching. These design techniques may each be associated with optimizing gain, reaching an acceptable noise level or figure, and controlling liner or non-linear amplifier performance. Substrates that the amplifier may be built on or within may include any type of substrate material using any type of field effect transistor (FET) known in the art, including, yet not limited to gallium arsenide (GaAs), indium phosphide (InP), and indium gallium phosphide (InGaP) materials/FETs. The parallel transistor configurations discussed within improve fundamental operating characteristics of amplifiers built using any type of substrate material or materials used to fabricate the FETs in the amplifier.

Apparatus of the present disclosure may contain any type of electronic package known in the art, including, yet not limited a circuit board, a quad flat pack, a ball grid array, multi-chip module, and a monolithic millimeter or microwave integrated circuits (MMIC), or an integrated circuit that may include wire bonds. Such apparatus may improve the noise figure and return loss performance of low noise receiver amplifiers. The present disclosure is also directed to protecting amplifiers from excessive RF input power, spike leakage, and electromagnetic pulses. Circuit topologies described in this disclosure result in numerous other improvements to amplifier circuits that may also include reduced input and output return loss. When used in combination with selected transistor parameters, such circuit topologies improve the performance of amplification circuits.

The terms "noise figure" or "noise factor," relate to measurements or values of degradation of the signal-to-noise ratio in an electrical circuit caused by the circuits or components of an amplifier circuit. The noise figure is used to evaluate the performance of an amplifier or radio receiver. Lower noise figure values are typically associated with better amplifier performance. The lower the noise figure, the less noise that is introduced into the signal by hardware included in an amplifier circuit.

FIG. 1 illustrates circuits of a three-stage amplifier that includes a set of field effect transistors connected in a parallel configuration. The amplifier 100 of FIG. 1 helps minimize a degradation of signal—to noise ratio of an amplifier, controls the "flatness" of amplifier gain over a range of frequencies, minimizes circuit control loss, and reduces effects of the 1/F corner frequency that tends to limit the performance of conventional low noise amplifiers. The amplifier of FIG. 1 is a low noise amplifier built as an integrated circuit or micro-chip module, such as a monolithic millimeter-wave or monolithic microwave (MMIC) device.

FIG. 1 includes signal input source 110 that may be a connector that may be connected to a test measurement system or an antenna. Connector 110 may be a coaxial connector or other connector standard in the art. Frequencies of a signal provided to input 110 may range from 10 million hertz (megahertz/MHz) to about 40-60 gigahertz (GHz), for example. Electrical components connected to input 110 include inductor L1 and transmission line TR1. Inductor L1 and other inductors illustrated in FIG. 1 are each identified by an item number that includes the capital letter "L." Each of the different inductors illustrated in FIG. 1 may simply be a length or loop of wire, where an inductance of a particular inductor may correspond to a wire gauge (diameter) and a length of the wire. Inductances of each of the different inductors illustrated in FIG. 1 may be selected when the amplifier of FIG. 1 is designed. Transmission line TR1 and other transmission lines illustrated in FIG. 1 may be designed to have specific impedance characteristics. For example, TR1 may have an impedance of 50 ohms at a frequency where the MMIC amplifier of FIG. 1 operates. Each of the transmission lines of FIG. 1 may be a micro-strip that includes an electrical conductor that may be located within a proximal distance of a ground located on a portion of the MMIC. For example, each of the transmission lines may be built into or onto an integrated circuit substrate. An impedance associated with inductor L1 and transmission line TR-1 may be adjusted to match an input impedance associated with a first stage amplification circuit that includes three different field effect (FET) transistors arranged in a parallel configuration.

Once the input signal passes through transmission line TR1, it is provided to the first stage amplification circuit of amplifier 100 that includes inputs to three different transistor circuits that are arranged in a parallel configuration. The first stage amplifier circuit of FIG. 1 may be considered as beginning at point 120 of FIG. 1 and ending at point 130 of FIG. 1. A first of the three different parallel circuits in this first amplifier stage includes inductor L2-1, transistor Q1-1, inductor L3-1, and inductor LA-1. A second of these three different parallel circuits includes inductor L2-2, transistor Q1-2, inductor L3-2, and inductor LA-2. A third of these three different parallel circuits includes inductor L2-3, transistor Q1-3, inductor L3-3, and inductor LA-3.

The various inductances of these parallel circuits may be selected during a tuning process that adjusts input return loss and a noise figure that may be associated with a minimum operating frequency of the low noise amplifier of FIG. 1. Inductors L3-1, L3-2, and L3-3 may be referred to as feedback elements associated with FET transistors Q1-1, Q1-2, and Q1-3 and with modeling equations that identify how impedances associated with inductors L3-1, L3-2, and L3-3 are reflected back to inputs of FET transistors Q1-1, Q1-2, and Q1-3. The inputs of inputs of Q1-1, Q1-2, and Q1-3 are a "gate" interconnect of each of these respective FET transistors that are located respectively where L2-1 connects to Q1-1, where L2-2 connects to Q1-2, and where L2-3 connects to Q1-3.

FET transistor Q1-1 includes a "source" interconnect connected to a first end of inductor L3-1, where a second end of inductor L3-1 is connected to a ground of amplifier 100. FET transistor Q1-2 includes a "drain" interconnect connected to a first end of inductor LA-1, where a second end of inductor LA-1 connects to capacitor C1 (point 130 of FIG. 1). FET transistor Q1-2 includes a "source" interconnect connected to a first end of inductor L3-2, where a second end of inductor L3-2 is connected to a ground of amplifier 100. FET transistor Q1-2 includes a "drain" interconnect connected to a first end of inductor LA-2, where a second end of inductor LA-2 also connects to capacitor C1 (point 130 of FIG. 1). FET transistor Q1-3 includes a "source" interconnect connected to a first end of inductor L3-3, where a second end of inductor L3-3 is connected to a ground of amplifier 100. FET transistor Q1-3 includes a "drain" interconnect connected to a first end of inductor LA-3, where a second end of inductor LA-3 also connects to capacitor C1 (point 130 of FIG. 1). Connections between L4-1, L4-2, LA-3, and capacitor C1 may also include a conductor disposed on a surface of an MMIC. By arranging the three different transistors Q1-1, Q1-2, and Q1-3 in parallel, an "effective width" of a "gate" associated with the first amplifier stage of amplifier 100 is increased. As mentioned above point 130 of FIG. 1 may be considered to be a location where the first stage amplifier circuit ends.

The parallel arrangement of the elements with selected impedances (i.e. the inductors) of this first amplification stage aid in matching both the input impedance and the output impedance of the first amplifier stage to be flat over a longer span of frequencies than is possible in an instance when only one FET is used in such a first amplification stage. This arrangement improves the signal-to-noise ratio, extends the "flatness" of gain, and minimizes circuit control loss of the amplifier of FIG. 1 while reducing negative effects of corner effects (e.g. 1/F gain reduction) associated with conventional amplifiers. The parallel configuration of the transistors in this first amplification stage also may increase the frequency range over with amplifier 100 operates. This may include lowering the operational frequency of a similar amplifier that does not include parallel transistors in an amplification stage. In certain instances, the increasing of the "effective gate width" of the parallel transistors Q1-1, Q1-2, and Q1-3 may be designed to lower a frequency of operation of an amplifier while reducing a maximum high operational frequency of such an amplifier. The parallel transistors (Q1-1, Q1-2, & Q1-3) may each be tuned to different corner frequencies to maintain flatness of gain while maintaining a signal-to-noise ratio. The gains versus frequency of transistors Q1-1, Q1-2, and Q1-3 may be adjusted by changing respective inductance values of the inductors connected to Q1-1, Q1-2, and Q1-3.

The signal from the first amplification stage is passed to a second amplification stage via coupling capacitor C1 and transmission line TR2. Capacitor C1 and transmission line TR2 may be considered inter-stage components that help match an impedance associated with the first amplification stage with an impedance associated with the second amplification state. The second amplification stage may be considered as beginning at point 140 and ending at point 150 of FIG. 1. The second amplification stage may include inductor L5, transistor Q2, and inductor L6. Components such as resistor R2, resistor R1, & inductor LF1 may also be considered components of the second amplification stage or be considered components that provide negative feedback to help stabilize operation of amplifier 100. While not illustrated in FIG. 1, a source interconnect of transistor Q2 may be coupled to an inductor instead of being coupled directly to ground as illustrated. A drain interconnect of transistor Q2 of FIG. 1 connects transistor Q2 to a first end of inductor L6 and a second end of inductor L6 connects to capacitor C2.

Capacitor C2 and transmission line TR3 may be considered components that couple signal to a third amplification stage of FIG. 1 that may be considered as beginning at point 160 and ending at point 170 of FIG. 1. As such, this third amplifier stage may include inductor L7, transistor Q3, and inductor L8. Capacitor C3, transmission line TR3, and resistor R3 may be considered components that couple an amplified signal to output 180.

As mentioned above the various inductors discussed in respect to FIG. 1 may be wires that act as inductors based on their gauge and/or length, where inductances of each of these inductors may be adjusted to tune operation characteristics of one or more stages of the amplifier 100 of FIG. 1. The amplifier of FIG. 1 may be a low noise amplifier comprising multiple parallel transistors laid out on, coupled to, or built into a MMIC substrate. In certain instances other components may be substituted for some or all of the aforementioned inductors.

A circuit similar to the amplifier 100 circuit of FIG. 1 that does not include multiple parallel transistors would have inferior operational characteristics as compared to the amplifier 100. The amplifier 100 of FIG. may be tuned in ways that a conventionally designed amplifier cannot be partly because each of a set of parallel transistors may be tuned to have different frequency response characteristics to maintain a gain over a span of frequencies that is larger than possible using amplifier stages that each include a single transistor. For Example, Q1-1 and related components may be tuned to pass frequencies F1 through F10, Q1-2 and related components may be tuned to pass frequencies F5 through F15, and Q1-3 may be tuned to pass frequencies F10 through F20 in order to maintain a desired flatness of gain over of all or a subset of frequencies F1 through F20. In such an instance, the second stage and the third stage amplifiers may be tuned to provide additional signal gain.

While the beginning and ending points of various amplification stages have been described to be located at various specific points (120/130, 140/160, & 160/170) of FIG. 1, one of ordinary skill in the art at the time of the invention would understand that the beginning and end points of a particular amplifier stage could be considered to be located at points that are slightly different in a given analysis or simulation. For example, the beginning/end points of the first amplification stage could be points 110/130 respectively, the beginning/end points of the second amplification stage could include points 130/150 respectively, and beginning/end points of the third amplification stage could include points 150/180 of FIG. 1. Each respective stage could include one or more transistors and a set of other components, where an amplified signal may pass from one amplification stage to another via one or more electrical contact(s), connection(s), transmission line(s), or component(s).

Each circuit element may be chosen, using a method of tuning an amplifier comprising the steps of first building the circuit and performing real world simulations and adjusting parameters. Parameters that may be adjusted may include wire length, wire gauge, or type of material. This tuning process may include repeating simulations while observing changes and trends in measured parametric data collected from real-world experiments. Parameters may be selected to adjust gain flatness over a desired frequency range, to meet a desired noise figure, or both. For instance, inductor L1 or other inductors of FIG. 1 may be wires of selected lengths and cross-sectional area(s) and a model designed to forecast performance considering these lengths and areas may be used to estimate performance of the amplifier. Simulated data may then be compared to data collected using circuits and real-world measurements. Coefficients in the model may be adjusted to help improve the model after which wire lengths, gauges, or materials may be changed in the model, additional estimates may be generated, fabricated circuits may be updated to correspond to the modeled configuration, and additional real-world data may be collected. These methods may be iterated to improve the model to account for each element in the amplifier circuit.

This process may include generating estimates for each transistor or amplification stage of an amplifier circuit. The process may also include changing types of transistors, (e.g. GaAs or InP FETS) or different transistor feature sizes or topologies may be used. As such, the design of a given amplifier may include different sizes, shapes, gate features (e.g. lengths, heights, widths), source features (e.g. lengths, heights, widths), and/or drain features (e.g. lengths, heights, widths). Other items that may be modified may include ion-implant depth of different semiconductor materials or relative sizes or topologies of one transistor part to another transistor part (source, gate, or drain). Here again real-world experimental data may be compared to modeled data to improve the model or to design an amplifier. A number of transistors in parallel in any stage can be varied when a circuit is designed or optimized. The number of transistors may then be selected along with the adjustment of their associated tuning elements.

The use of field effect transistors (FETs) allows for a parallel configuration of transistors allow signals to be amplified without changing a phase or inversion of an input signal as would occur if bipolar transistors were connected in a parallel configuration and may use fewer transistors as compared to a bipolar transistor differential amplifier with transistors in a parallel configuration.

Figure 2:
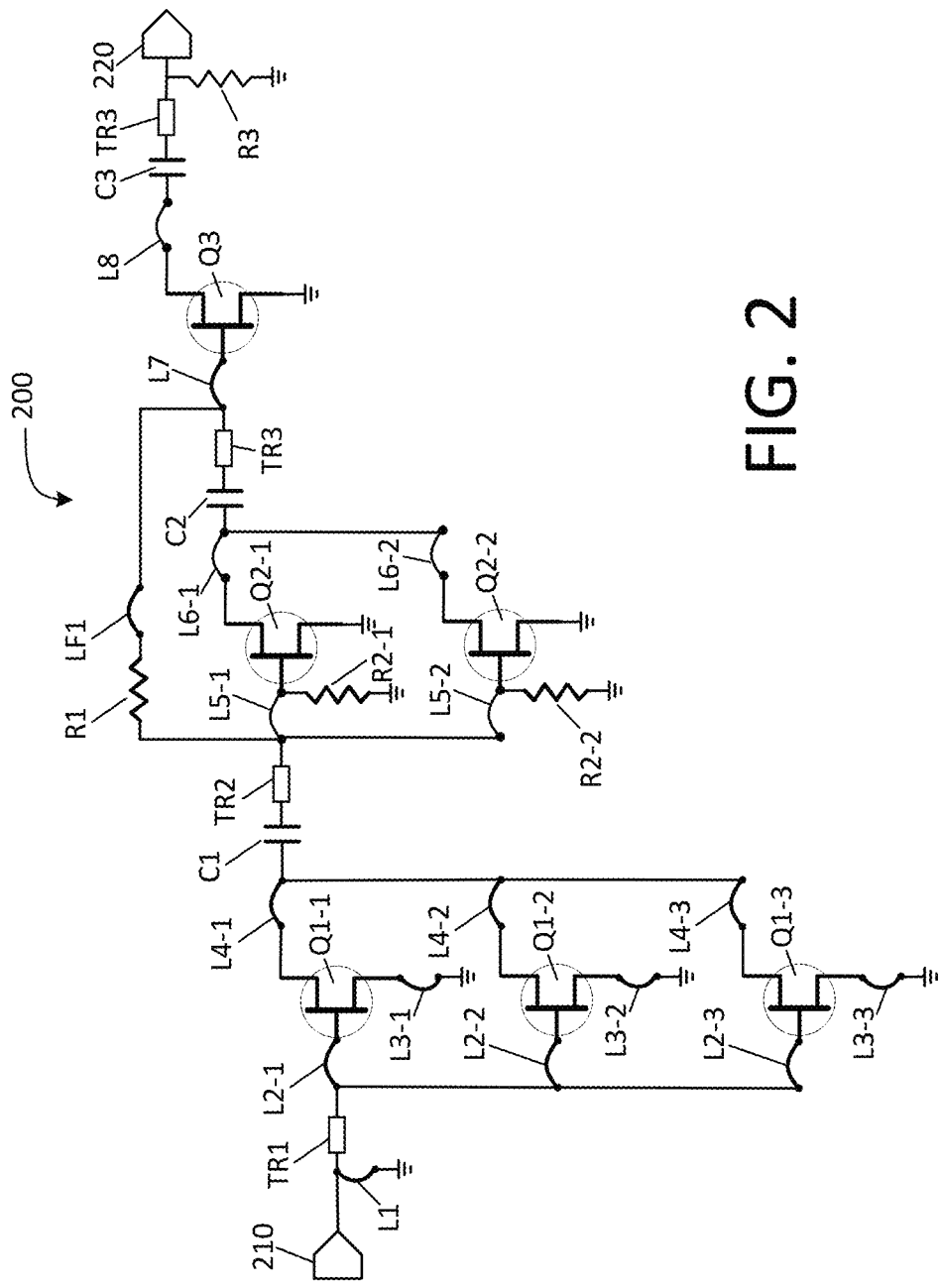
FIG. 2 illustrates an amplifier circuit that includes two stages of field effect transistors connected in a parallel configuration.

FIG. 2 illustrates an amplifier circuit that includes two stages of field effect transistors connected in a parallel configuration. The amplifier 200 of FIG. 2. FIG. 2 includes many of the same components as FIG. 1 that perform functions consistent with the various amplifier stages, coupling, and feedback components of amplifier 100 of FIG. 1. FIG. 1 includes input connector 210 (that receives an input signal), inductor L1 and transmission line TR1 that pass the input signal to a first stage amplifier. Here again the first stage amplifier consists of three different transistor circuits connected in parallel. The components of this first stage amplifier also include inductors (L2-1, L2-2, L2-3, L3-1, L3-2, L3-3, LA-1, LA-2, LA-3) and FET transistors Q1-1, Q1-2, and Q1-3. This first amplifier stage is coupled to a second amplifier stage via capacitor C1 and transmission line TR2. This second amplification stage includes two different transistor circuits connected in parallel. A first transistor circuit of this second amplification stage includes inductor L5-1, Q2-1, and inductor L6-1. A second transistor circuit of this second amplification stage includes inductor L5-2, Q2-2, and inductor L6-2. Resistors R2-1 and R2-2 as well as resistor R1 and inductor LF1 may act as feedback that affect the operation of the second amplification stage of FIG. 2. Capacitor C2 and transmission line TR3 may be considered components that couple signal to a third amplification stage of FIG. 2 that includes inductor L7, transistor Q3, and inductor L8. Capacitor C1, transmission line TR3, and resistor R3 may be considered as components that couple signal to output 220 of FIG. 2. While not illustrated in FIG. 2, source interconnects of transistors Q2-1 and Q2-2 may be coupled to other components (e.g. respective inductors) instead of being directly connected to ground as illustrated.

The use of two different amplification stages where each of these stages include a set of parallel transistor circuits may be used to further tune the operation of an amplifier circuit. One benefit that such a configuration may provide is the ability to further lower a frequency of operation of the amplifier. Such a configuration may provide both the ability to pass a larger frequency range while maintain signal strengths within that larger frequency range within a desired variance. Such a configuration may also allow amplifier circuits to be built that both lower an operational frequency while maintaining amplifier performance at higher frequencies. Methods and circuit topologies of the present disclosure, thus provide a designer with the ability to optimize the operation of amplifier circuits to meet the requirements of modern telephone, telecom, satellite, and ground and/or space based communication equipment.

Figure 3A:
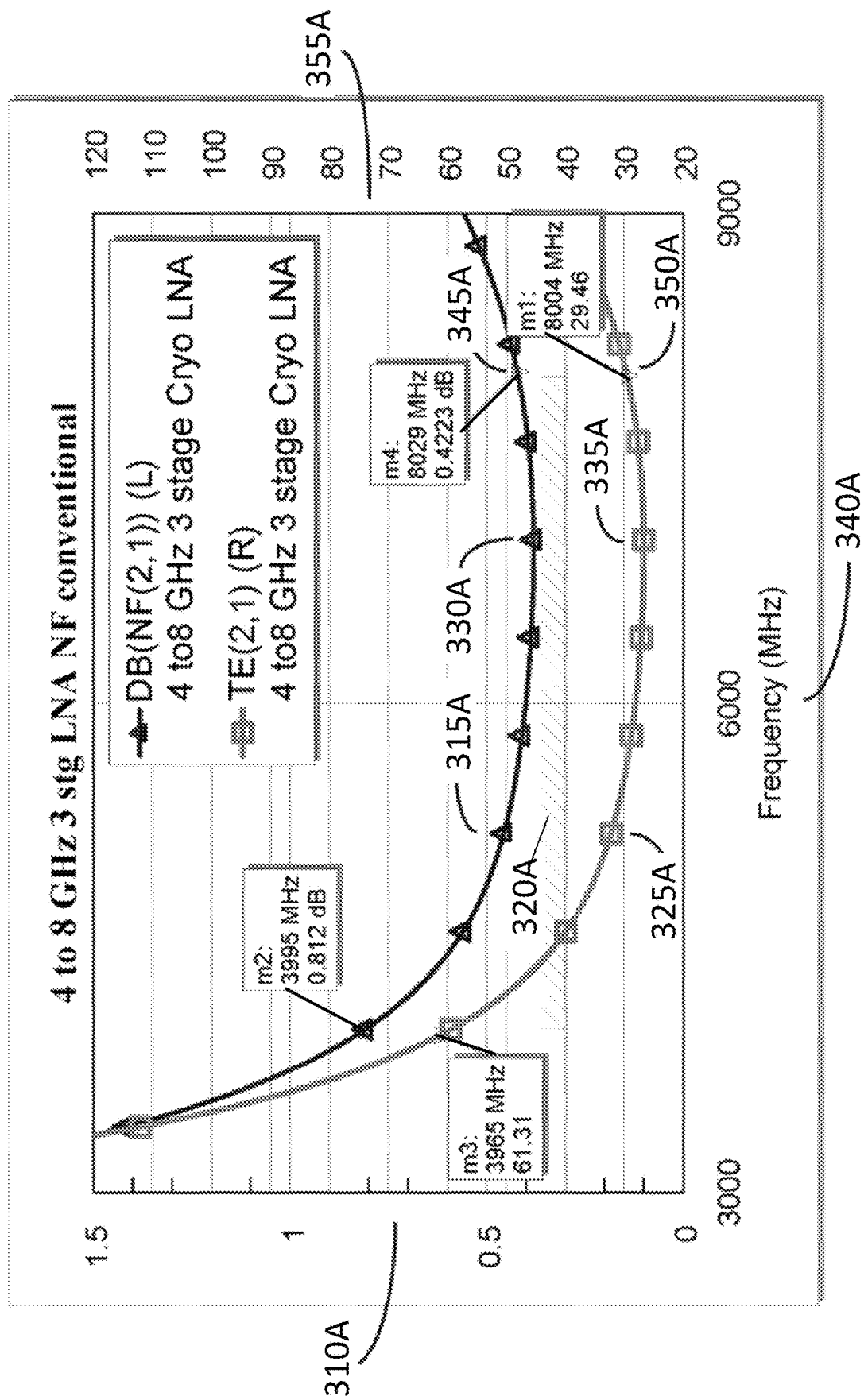
FIG. 3A illustrates noise figures associated with an amplifier that does not include field effect transistors connected in a parallel configuration.

FIG. 3A illustrates noise figures associated with an amplifier that does not include field effect transistors connected in a parallel configuration. FIG. 3A includes both an X axis that corresponds to frequency and a Y axis that corresponds to noise figure over frequency range 340A. The X axis of FIG. 3A ranges from 3000 megahertz (MHz) to 9000 MHz, or put in terms of gigahertz (GHz) 3 GHz to 9 GHz. The Y axis or noise figure axis of FIG. 3A has two different scales, a first scale 310A on the left side of FIG. 3A that corresponds to decibels (dB) and a second scale 355A of the right side of FIG. 3A that corresponds to noise figure expresses in Kelvin noise temperature. Note that the X axis of FIG. 3A is a linear scale and that the Y axes of FIG. 3A have logarithmic scales.

The top curve 330A of FIG. 3A illustrates noise figure in dB versus frequency (F) measured for a particular conventional amplifier. The bottom graph of FIG. 3A illustrates noise figure in Kelvin (K) versus frequency F for the particular amplifier. A formula for converting noise figure in dB to noise figure in K may be represented as NF (dB)=10 $\text{Log}_{10}$ [(noise-Temp/ref-Temp)+1)]. At room temperature of 25° C. or 298.15 K this formula corresponds to NF (dB) 10 $\text{Log}_{10}$ [(noise-Temp/298.15)+1.

The top curve 330A of FIG. 3A includes triangular identifiers and several sample points, where some of these sample points correspond to identifiers m2, 315A, 345A, and m4. Note that point m2 is associated with a frequency of 3995 MHz and a noise figure of 0.812 dB and that point m4 is associated with a frequency of 8029 MHz and a noise figure of 0.4233 dB. Points 315A and 345A of top curve 330A are corner frequencies of the amplifier.

The bottom curve 335A of FIG. 3A includes square identifiers and several sample points, where some of these sample points correspond to identifiers m3, 325A, 350A, and m1. Point m3 is associated with a frequency of 3965 MHz and a noise temperature of 61.31 Kelvin and point m1 is associated with a frequency of 8004 MHz and a noise temperature of 29.46 Kelvin.

The zone associated with the set of hashed lines 320A illustrates an area of FIG. 3A that may be referred to as an ideal or reference operational noise figure/frequency zone of operation of an amplifier. In certain instances, an amplifier that operates within the zone of hashed lines 320A noise figure/frequency zone for a given range of operational frequencies may be considered as an amplifier that operates adequately for a given application.

Note the shape of the curves of FIG. 3A since the vertical Y axis of FIG. 3A has a logarithmic scale, changes in the noise figure versus frequency in reality are very dramatic as compared to what a casual observer might realize by quickly looking at the graph. The curves of FIG. 3A show that conventional amplifiers built without transistors connected in a parallel configuration have noise figures that change by orders of magnitude as frequencies change between 3000 MHz and 9000 MHz.

Figure 3B:
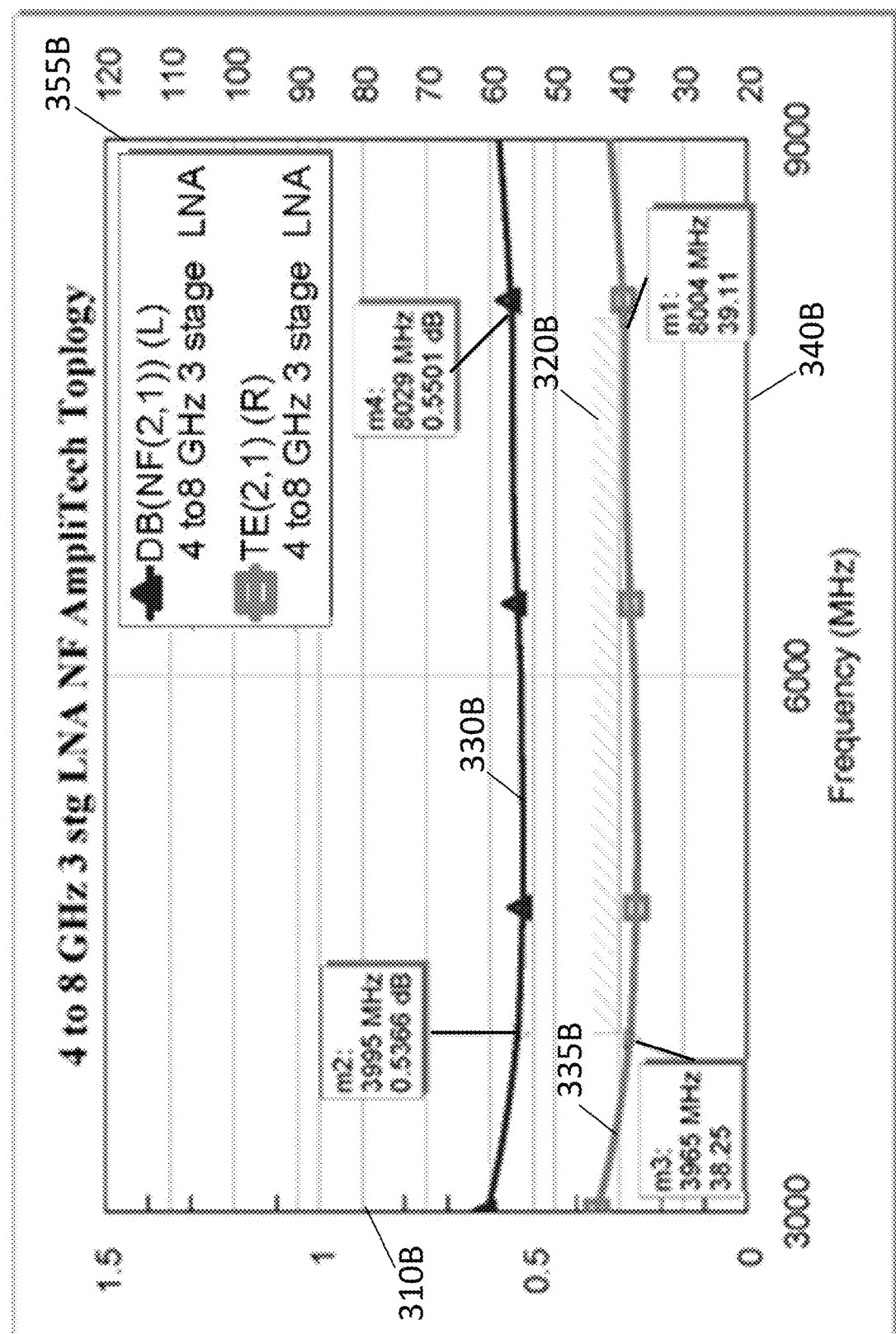
FIG. 3B illustrates noise figures associated with an amplifier that includes field effect transistors connected in a parallel configuration.

FIG. 3B illustrates noise figures associated with an amplifier that includes field effect transistors connected in a parallel configuration. Here again two different curves are illustrated, a top curve 330B that includes triangle shaped points and a bottom curve 335B that includes square shaped points. FIG. 3B includes an X axis 340B (frequency in MHz) and X axes 310B in dB & 355B in Kelvin Note that curves of FIG. 3B are much flatter than the curves of FIG. 3A. This shows that the parallel FET circuit configurations of FIGS. 1-2 dramatically improve noise figure performance in frequency ranges between 3000 MHz and 9000 MHz.

Items m2 and m4 illustrate that noise figure for an amplifier of the top curve 330B of FIG. 3B at 3995 MHz has a value of 0.5366 dB and has a noise figure at 8029 MHz has a value of 0.5501 dB. Points m2 and m4 correspond to points at the upper curve 330B that are within a frequency range identified by the hashed lines 320B of FIG. 3B. Within this range, the noise figure for an amplifier of the top curve 330B of FIG. 3B changes only by 0.0135 dB.

Items m3 and m1 in FIG. 3B illustrate that noise figure for an amplifier at 3965 MHz has a value of 38.2 Kelvin and a noise figure at 8004 MHz has a value of 39.1 Kelvin. Points m3 and m1 correspond to points of the lower curve 335B that are within a frequency range identified by the hashed lines 320B of FIG. 3B. Within this range noise figure for an amplifier of the bottom curve 335B of FIG. 3B changes only by 1.1 Kelvin.

When differences in values of noise figure of FIG. 3B associated with points m2/m4 (3995 MHz & 8029 MHz) and m3/m1 (3965 MHz & 8004 MHz) are compared to points m2/m4 and m3/m1 of FIG. 3A, changes in values of noise figures of FIG. 3A are much larger than changes in values of noise figures of FIG. 3B. Respectively, FIG. 3A shows changes in noise figure of 0.3897 dB and 31.85 Kelvin; these numbers are much larger than the changes in noise figure of FIG. 3B of 0.0135 dB and 1.1 Kelvin. This demonstrates that the use of parallel FET transistors improves values of noise figure by over an order of magnitude. The improvement is approximately 290% (290% less noise factor variance) for each of curves of FIG. 3A as compared to FIG. 3B.

Figure 4A:
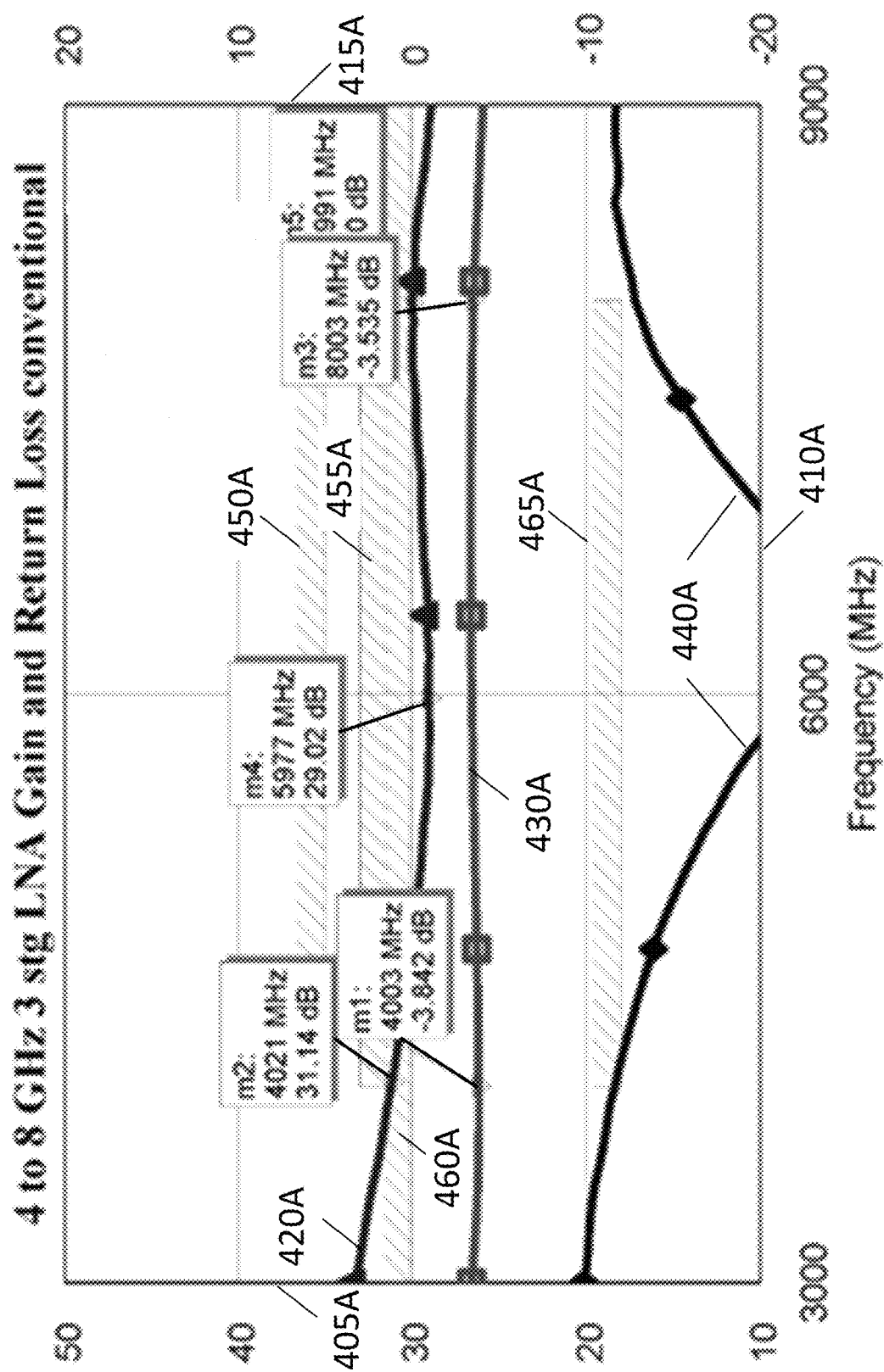
FIG. 4A illustrates measures of gain, input return loss, and output return loss for an amplifier that does not include field effect transistors arranged in a parallel configuration.

FIG. 4A illustrates measures of gain, input return loss, and output return loss for an amplifier that does not include field effect transistors arranged in a parallel configuration. The graphs of FIG. 4A shows plots of input gain 420A, input return loss 430A, and output return loss 440A for an amplifier built with a conventional design. The curves of FIG. 3A and FIG. 4A are associated with the same conventional type of amplifier. FIG. 4A includes an X axis of frequency 410A that ranges from 3000 MHz to 9000 MHz and two different linear Y axes scales 405A in dB and 415A in Kelvin. Hashed line 450A illustrates an upper target gain level over a frequency range of about 4000 MHz to about 8000 MHz and the hashed line 455A illustrates a lower target gain level over this same frequency range (4000 MHz-8000 MHz). These hashed lines indicate that for a given application that the target gain for an amplifier should be between about 32 dB and 37 dB. FIG. 4A shows that this conventional amplifier has a gain that barely meets the minimum target at a frequency of 4000 MHz and that the gain reduces below this minimum target at frequencies above 4000 MHz. What this shows is that the conventional amplifier associated with FIG. 4A would likely not perform very well for a first intended application. FIG. 4A shows gain varying from about 33 dB at 3000 MHz to about 29 dB at 9000 MHz and shows gain for this conventional amplifier at various sample points (point m2 has a gain of 31.41 dB at 4021 MHz and point m4 has a gain of 29.02 at 5977 MHz).

Hashed line 460A may identify a maximum specified amount of input return and output return loss of an amplifier for a first application that operates at frequencies between 3000 MHz and 9000 MHz. Hashed line 465B may correspond to a desired preferred amount of input return loss and output return loss associated with the amplifier when it operates between 4000 MHz and 8000 MHz for that first application. What this means is that to meet requirements of this first application that both input return loss and output return loss curves 420A and 430A must be below values associated with hashed line 460A and preferably should not exceed values associated with hashed line 465A. Curve 430A of FIG. 4A shows an input return loss at point m1 of −3.842 dB below hashed line 460A at 4003 MHz and an input return loss of −3.535 dB below hashed line 460A at 8003 MHz.

FIG. 4A shows that a conventionally designed amplifier would not quite meet gain requirements of the first application. The location of curve 430A shows that this conventional amplifier would have acceptable, yet not preferred levels of input return loss for this first application. Finally, FIG. 4A shows that the convention amplifier has acceptable values of output return loss between frequencies of about 4000 MHz and 8000 MHz because curve 440A is below values associated with curve 465A. All of these factors combined indicate that the conventional amplifier would not be well suited for use in the first application.

Figure 4B:
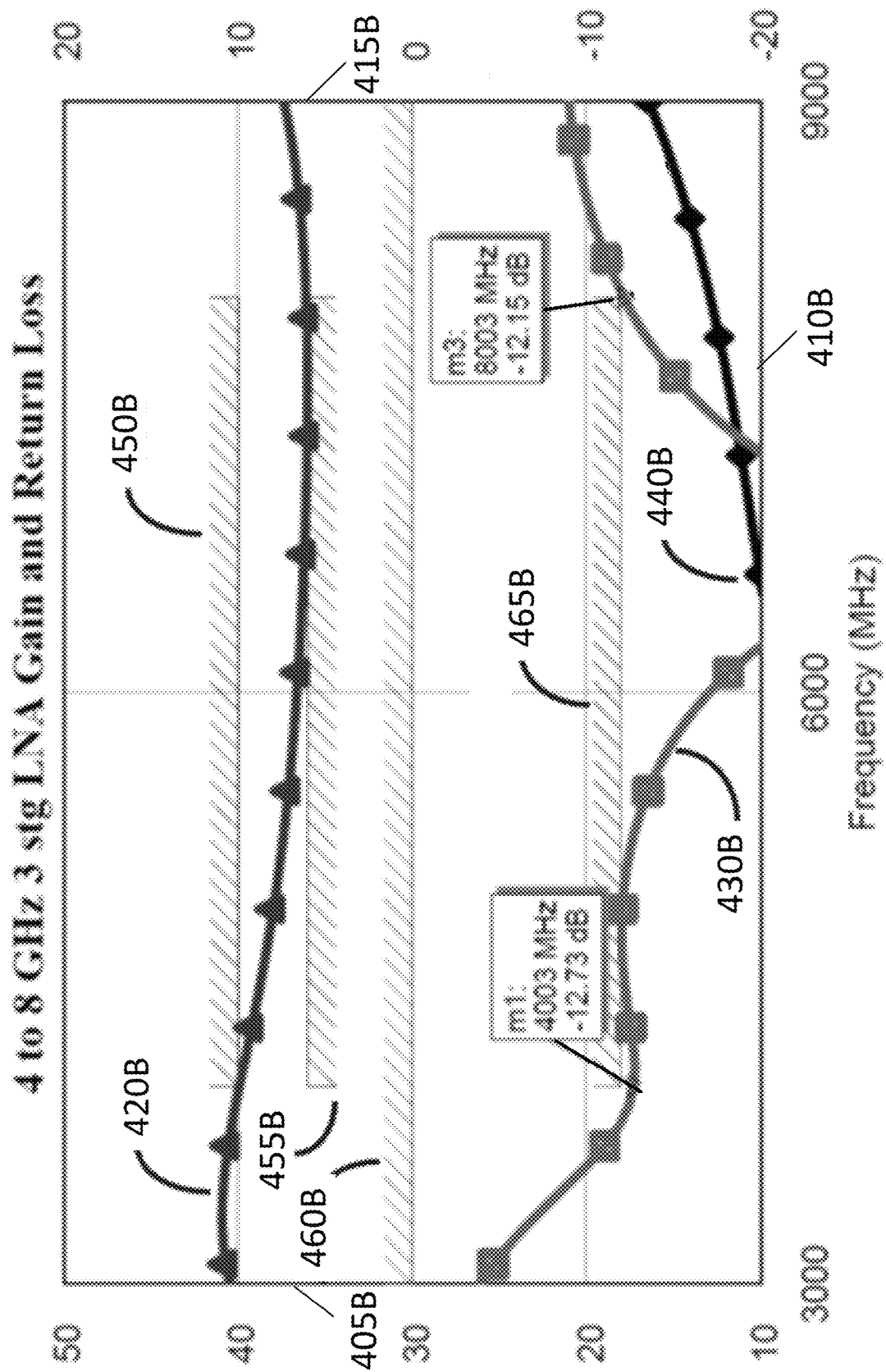
FIG. 4B illustrates measures of gain, input return loss, and output return loss for an amplifier that includes field effect transistors arranged in a parallel configuration.

FIG. 4B illustrates measures of gain, input return loss, and output return loss for an amplifier that includes field effect transistors arranged in a parallel configuration. FIGS. 3B and 4B are associated with a same type of amplifier that includes FETs arranged in a parallel configuration. FIG. 4B includes gain curve 420B that includes the triangle shaped points, input return loss curve 430B that includes the square shaped sample points, and output return loss curve 440B that includes the diamond shaped sample points. FIG. 4 includes both an X axis 410B showing frequencies ranging from 3000 MHz (3 GHZ) to 9000 MHz (9 GHz) and Y axes using two different scales 405B & 415B. Here again the left Y axis scale 405B is a decibel (dB) scale and the right scale Y axis is a scale 415B in Kelvin. Here both the X axis and the Y axis scales are both linear scales.

Note that gains associated with the gain curve vary between about 35 dB to about 42 dB for a second target application. The hashed line 450B illustrates an upper target gain level for over a frequency range of about 4000 MHz to about 8000 MHz and the hashed line 455B illustrates a lower target gain for level over this same frequency range (4000 MHz-8000 MHz). This upper hashed line 420B spans a small range from about 40 dB to about 42 dB and the lower hashed line 455B spans a small range from about 33 dB to about 35 dB. Note that the gain of the parallel transistor amplifier varies from about 40 dB down to about 35 dB in the frequency range of 4000 MHz to 8000 MHz. In an instance where a specification for a gain of an amplifier required (e.g. for the second target application) that a gain located within the range specified by the upper hashed line 450B and the lower hashed line 455B, such a specification would require a minimum gain of about 34 dB and a maximum gain of 42 dB. Since gain curve 402 stays within this range, the parallel transistor amplifier would meet the required gain over the desired frequency range of 4000 MHz to 8000 MHz for this second target application.

Hashed line 460B may represent levels of a maximum amount of input return and output return loss of an amplifier that operates at frequencies between 3000 MHz and 9000 MHz. Hashed line 465B may correspond to a desired maximum preferred amount of input return loss and output return loss associated with the amplifier when it operates between 4000 MHz and 8000 MHz for a given application. Values of input and output return loss within or below levels of hashed line 465B would more than meet requirements of input and output return loss for the second target application. Note that hashed line 460B varies between 30 dB and about 32 dB and that hashed line 465B varies between about 18 dB and 20 dB. Note that the performance of the amplifier meets the required input and output return loss requirements by not exceeding levels indicated by either hashed line 460B or 465B.

The various measures of gain and return loss discussed above in terms of dB correspond to levels of gain and return loss in terms of Kelvin, the correspondence between dB and Kelvin may be identified by referring the different Y axis scales 405B in dB and 415B in Kelvin of FIG. 4B.

The performance curves of FIGS. 3A, 3B, 4A, & 4B show that the amplifier associated with FIGS. 3B & 4B has superior performance in terms of noise figure, gain, input return loss, and output return loss as compared to the amplifier associated with FIGS. 3A & 4A. This data demonstrates that amplifiers built with the parallel configuration illustrated in FIGS. 1-2 have flatter noise figure curves, higher gain, and lower measures of input and output return loss as compared to amplifiers of a conventional design.

While FIGS. 3B & 4B illustrate operational performance of amplifiers that use FET transistors in parallel configurations operating at frequencies 9 GHz, functionality of these or similar parallel FET transistors circuits have been shown to successfully operate at frequencies up to and beyond 30 GHz when those circuits are cooled to extremely cold or cryogenic temperatures. Examples of these extremely cold temperatures are temperatures less than −100° C. (C) (173 degrees Kelvin (K)), where cryogenic temperatures are commonly referred to as temperatures between −150° C. (123° K.) and −273° C. (0° K.). Certain coolers referred to as Stirling cryocoolers have the capacity to cool a cold side of a cryocooler to −240° C. or about 43 degrees Kelvin. In certain instances, an operating temperature of liquid nitrogen may be selected. Liquid nitrogen has a temperature of about −196° C. Virtually any temperature or pressure may be selected as a target operating temperature or pressure. Sensors may be used to sense temperature or pressure and data from (e.g. voltage/current measures or digital data) these sensors may be used to identify whether a corrective action should be initiated. For example, a control circuit evaluating sensor data may identify that a pressure or temperature has met or exceeded a threshold level that would reduce efficiency of electronics contained within a vacuum chamber. For example, if a seal were to fail pressure within the chamber could increase to or beyond a pressure threshold level. If a cooler were to fail, operating temperatures inside of the vacuum chamber could increase beyond a temperature threshold. In instances when temperatures or pressures are detected outside of a desired operating range, the control electronics could send a message indicating that the apparatus be fixed.

Benefits of operating at such low temperatures include reducing operating current and power dissipation, reducing noise figure of even the parallel transistor amplifier designs discussed herein, small form factor, extension of operational frequencies, reduced signal distortion, reduces phase noise, lower passive inter-modulation, and little to no maintenance. By operating at these low temperatures, operation of the amplifier circuits discussed in respect to FIGS. 1-2 may be extended to 30 GHz or beyond. Such operating frequencies allow amplifier circuits to operate more efficiently and more cost effectively in the emerging spaces of fifth generation (5G) and sixth generation (6G) cellular networks. Such amplifiers may also use waveguides for input and output signals. Amplifier circuits reviewed in the present disclosure may also be coupled to a multiple input/multiple output (MIMO) antennas. All of this allows for superior 5G/6G network performance including data speed and accuracy. Such amplifiers cooled to cryogenic temperatures are superior to alternatives due to number of improvements that the designs discussed herein provide. These self-contained, cooled Low Noise Amplifiers have the capability to operate for years with no maintenance required. These attributes and the special vacuum chamber/enclosure) reviewed below isolates an amplifier from the outside environment.

Figure 5:
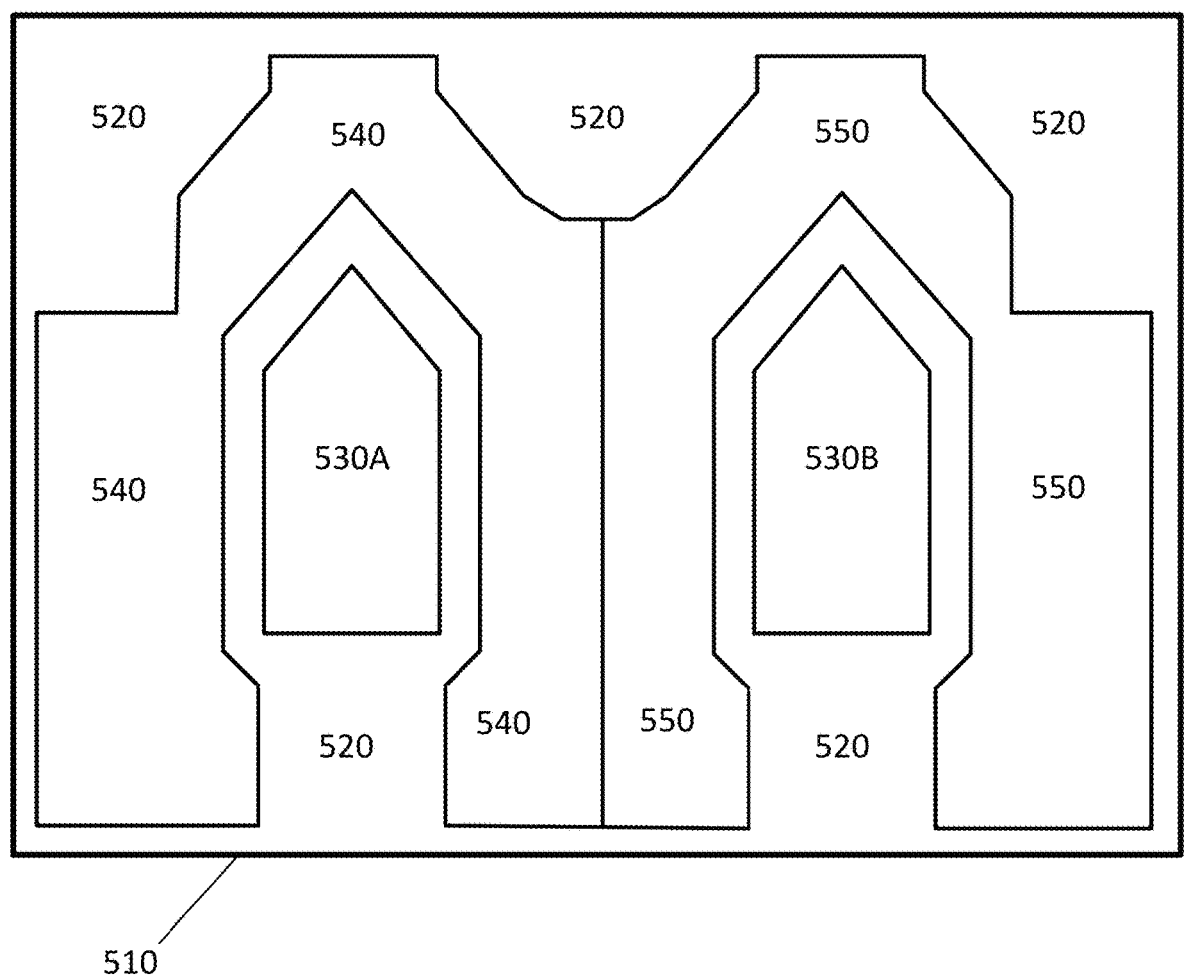
FIG. 5 illustrates a top view of a transistor that may be attached to or incorporated into a monolithic millimeter/microwave integrated or other amplifier circuit.

FIG. 5 illustrates a top view of a transistor that may be attached to or incorporated into a monolithic millimeter/microwave integrated or other amplifier circuit. The millimeter or microwave integrated circuit (MMIC) of FIG. 5 includes transistor 510 of FIG. 5 includes areas 520, 530A, 530B, 540, and 550. Note that FIG. 5 shows that area 520 surrounds each of areas 550, 540, 530A, and 530B. Area 520 may be made of material that may be a semiconductor material, an insulator, or a material with greater resistance than materials located within areas 550, 540, 530A, and 530B. Each of areas 550, 540, 530A, and 530B may include a metallic pad to which wires may be attached or bonded to. Areas 540, 550, 530A, and 530B may be a source, drain, or gate portion of and FET transistor 510 depending on the layout of a particular transistor. Areas 530A and 530B may both be areas were connections to a gate of FET transistor 510 may be attached to. In such an instance area 540 may be an area where connections to a source of the transistor are attached to, and area 550 drain may be an area where connections of a drain of the transistor are attached to. Transistor 510 may be a field effect transistor (FET) of a particular type and each of the transistors of FIGS. 1-2 may be field effect transistors like transistor 510. FET 510 may be a gallium arsenide (GaAs) type, indium phosphide (InP) type, or other type of FET transistor.

As discussed above an MMIC is one possible type of electronic assembly that could be used to build a low noise amplifier implemented as a monolithic millimeter or microwave integrated circuit that includes at least two transistors. Metallization pads on a surface of a monolithic millimeter or microwave integrated circuit (MMIC) may be used to connect to a power supply input, a ground connection, an antenna, or to an output that leads to the next stage of circuitry. Bonds may be used to connect to the gate of a first FET transistor via a wire. Such FET transistors may have metalized pads that may be shaped like gate areas 530A & 530B, and metalized areas of FIG. 5 like areas 540 and 550 of FIG. 5.

As discussed in respect to FIGS. 1-2, amplifiers may include FETs connected in parallel configurations and may include capacitors, resistors, and/or transmission lines that have a controlled impedance. Furthermore, an MMIC may include or be comprised of a substrate. Also, more than one wire may connect different features or different parts of a circuit in parallel or serial as desired. This may allow the designer to adjust inductances and/or stray capacitances in a circuit when impedances and related frequency response figures (noise factors, gains, input/out return loss factors) are tuned. For example, two different wires in parallel may alter a total impedance by varying both capacitance and inductance associated with respective portions of a circuit.

Figure 6:
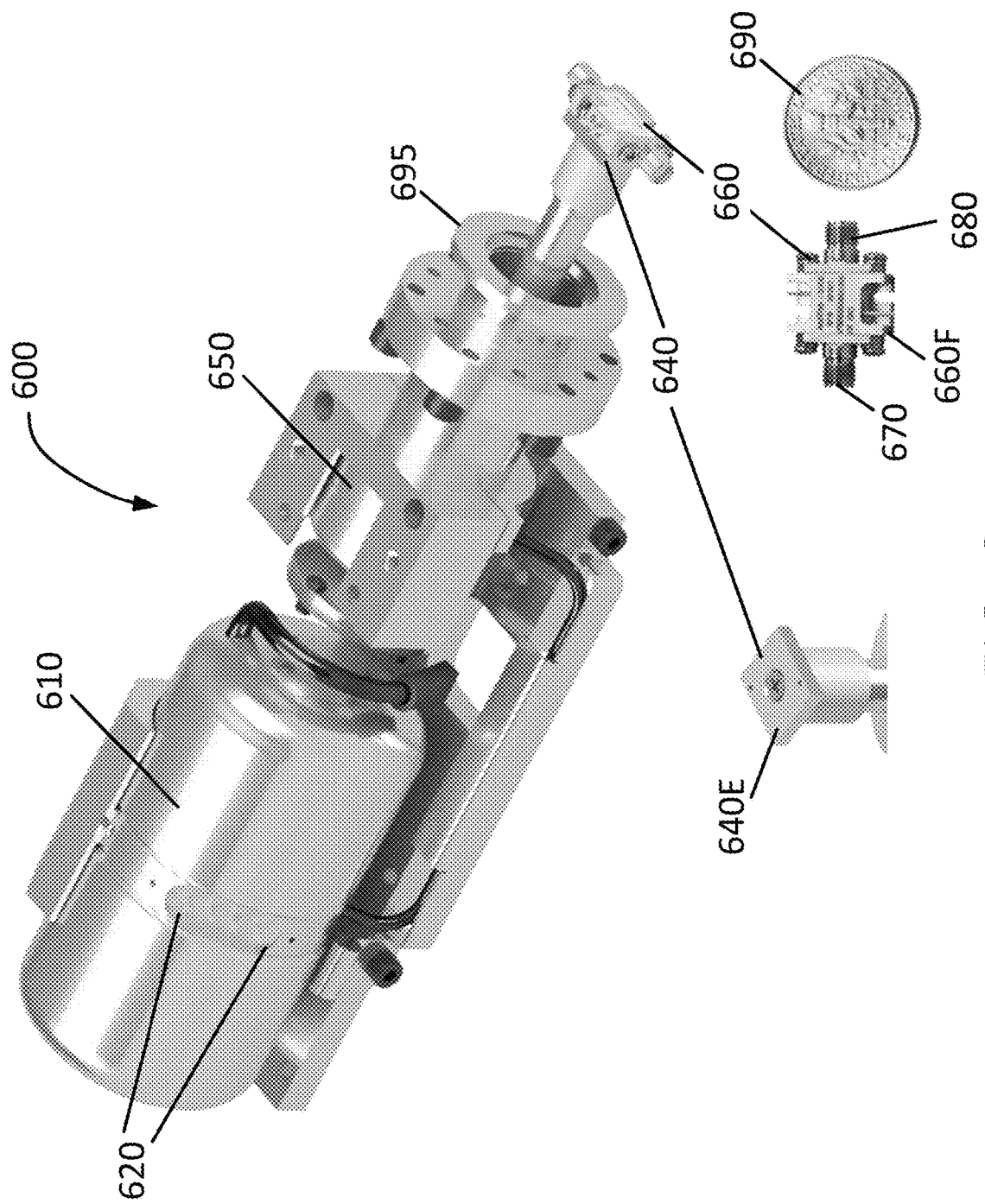
FIG. 6 illustrates a "Striling" type cryocooler coupled to a case that encloses a low noise amplifier.

FIG. 6 illustrates a "Striling" type cryocooler coupled to a low noise amplifier. The cryocooler assembly 600 of FIG. 6 includes components that may drive one or more pistons that may be contained at a first portion 610 of cryocooler 600. These components may include electrical contacts 620 that that provide electrical power to a stator of a linear motor built within the first portion 610 of the cryocooler 600 that coverts motion into a thermal transfer. Changing voltages at the electrical contacts 620 drive a piston internal to the cryocooler 600 in a first direction and in a second direction that may be perpendicular to a length of cryocooler 600. This movement pressurizes gas contained within the cryocooler when the piston moves in the first direction and that allow the gas to expand with the piston moves in the second direction. Relative motion between the piston and a displacer inside of the cryocooler 600 causes movement of the gas through valves contained within the cryocooler that results in a cold portion 640 of the cryocooler cooling down and results in heat being transferred to heated portion 650 of the cryocooler where the heat is transferred into the environment via a heatsink. The heat transfer is based on the perfect gas law, the controlled compression and expansion of gasses included in the Stirling cryocooler, and the transmission of heat via thermal sinks (e.g. heat sinks). The use of an inert gas such as helium may be used to increase the efficiency of cryocooler 600. This allows the cold portion 630 of the cryocooler 600 to be cooled down to cryogenic temperatures of about −150° C. (C) to −230° C. or lower, for example.

Metallic parts located at or coupled to the heated portion 650 of the cryocooler 600 transfer heat to the environment. These metallic parts may also be coupled to structural elements of a case that contains cryocooler 600 or may be coupled to a thermoelectric cooler. The movement of air by a fan, for example, may also be used to help cool the heated portion 650 of cryocooler 650.

The cold portion 640 of cryocooler 600 is shown as being physically attached to a nelectronic assembly/amplifier 660 that contains a low noise amplifier circuits such as the amplifier circuits illustrated in FIGS. 1-2. As mentioned above, electronic assembly 660 may be any type electronic circuit assembly, including, yet not limited to a circuit board, a quad flat pack, a ball grid array, multi-chip module, and a monolithic millimeter or microwave integrated circuit (MMIC), or an integrated circuit that may include wire bonds.

FIG. 6 also includes an edge view of the cold portion 640E of cryocooler 600. Note that this edge has a flat surface upon which electronic assembly 660 rests when assembly 660 is attached to the cold portion 640 of cryocooler 600. Cold portion 640 may be made of any type of thermally conductive material. For example, cold portion may be made from electrically conductive materials, such as a type of metal (e.g. aluminum, steel, or other) or may be a type of graphene that thermally transfers heat. Such thermal transfer materials could be a non-electrically conductive material, such as a polymeric material of a nitride or oxide material. In certain instances, a thermal transfer material may be disposed between the flat surface 640E and case 660. For example, cold portion 640 may be made of metal that may be attached to a piece of graphene that is in turn attached to a case of assembly 660.

FIG. 6 also includes a front view 660F of case 660 that includes input connector 670 and output connector 680. As mentioned above an input connector such as connector 670 may be attached to an antenna and an output connector such as connector 680 that provides an amplified signal to other equipment of components of a communication system. Note that the area consumed by the front view 660F of assembly 660 is close to the area of a United States dime or ten cent piece 690.

Cryocooler 600 of FIG. 6 also includes flange 695 that may be clamped to another flange when a vacuum chamber that encloses electronic assembly 660 is formed. This clamped connection may include a gasket or O ring disposed between the two flanges to form a vacuum tight seal. Such a vacuum chamber would allow electronic assembly 660 to be enclosed entirely within a low temperature/low pressure chamber that is well suited for preventing electronic components, such as FETs of an amplifier from generating electrical noise. Low temperature operation using circuits built according to the schematics of FIGS. 1-2 have been shown to extend the ability for low noise amplifiers to operate at frequencies up to and beyond 30 gigahertz (GHz).

Figure 7:
FIG. 7 illustrates a vacuum chamber assembly that may be connected to an end of a Stirling cryocooler.
Figure 7:
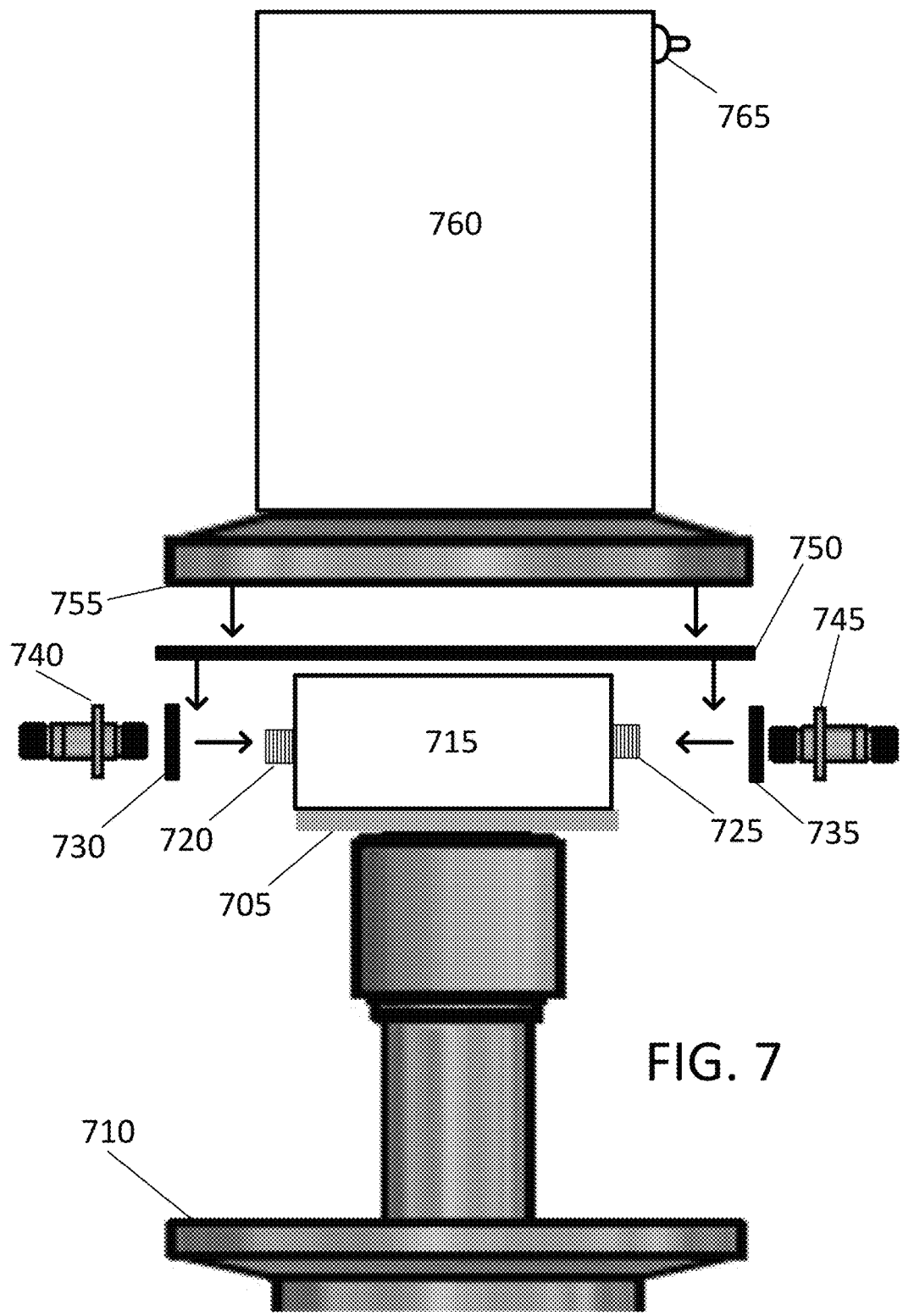

FIG. 7 illustrates a vacuum chamber assembly that may be connected to an end of a Stirling cryocooler. Item 705 of FIG. 7 is a chilled part of a cold end of a cryocooler that includes first flange 710 that may be used to form a vacuum chamber that contains electronic assembly 715. FIG. 7 includes chamber portion 760 that includes a second flange 755 and valve 765. Flanges 710 and 755 may be clamped together with a clamp that is similar to a common sanitary clamp (i.e. tri-clamp) after seal 750 has been placed between flange 710 and 755. Flanges 710 and 755 may be an NW25 type of flange used in vacuum systems. FIG. 7 also includes electronic assembly 715, seals 730 & 735, and electrical connection extenders 740 & 745. Seals 730, 735, and 750 may be any type of seal capable of maintaining a vacuum with a vacuum chamber when that chamber is cooled to cryogenic temperatures. As such, the seals of FIG. 7 may be gaskets or O rings. Electronic assembly 715 includes electrical connectors 720 & 725 to which electrical connection extenders 740 & 745 may be attached.

The vacuum chamber may be assembled after electronic component 715 has been attached to an upper flat surface of chilled part 705. The arrows included in FIG. 7 illustrate how various parts illustrated in FIG. 7 may be moved when the vacuum chamber of FIG. 7 is assembled. Assembling of the vacuum chamber of FIG. 7 includes placing seal 750 on flange 710, placing the flange 755 of chamber portion 760 on seal 750, and by clamping flange 755 to flange 710 with a clamp. Next, seal 730 may be placed on connection extender 740 and the right portion of connection extender 740 may be passed through a hole in the left side of chamber portion 760. Seal 735 may then be placed on connection extender 745 and the left portion of connection extender 745 may be passed through a hole in the right side of chamber portion 760. The process of connecting connection extenders 740 & 745 to connectors 720 & 725 may include screwing each respective connection extenders onto each respective connector when an electrical connection is formed. The process of attaching the connection extenders to the connectors may compress seals 730 and 735.

After the vacuum chamber has been assembled, a vacuum may be applied to valve 765 to a desired vacuum pressure. This process may remove all atmospheric gasses from the vacuum chamber. In operation, the cold part 705 of the Stirling cryocooler could be cooled down a desired temperature, for example −150° C. (C) to −230° C. or lower.

Figure 8:
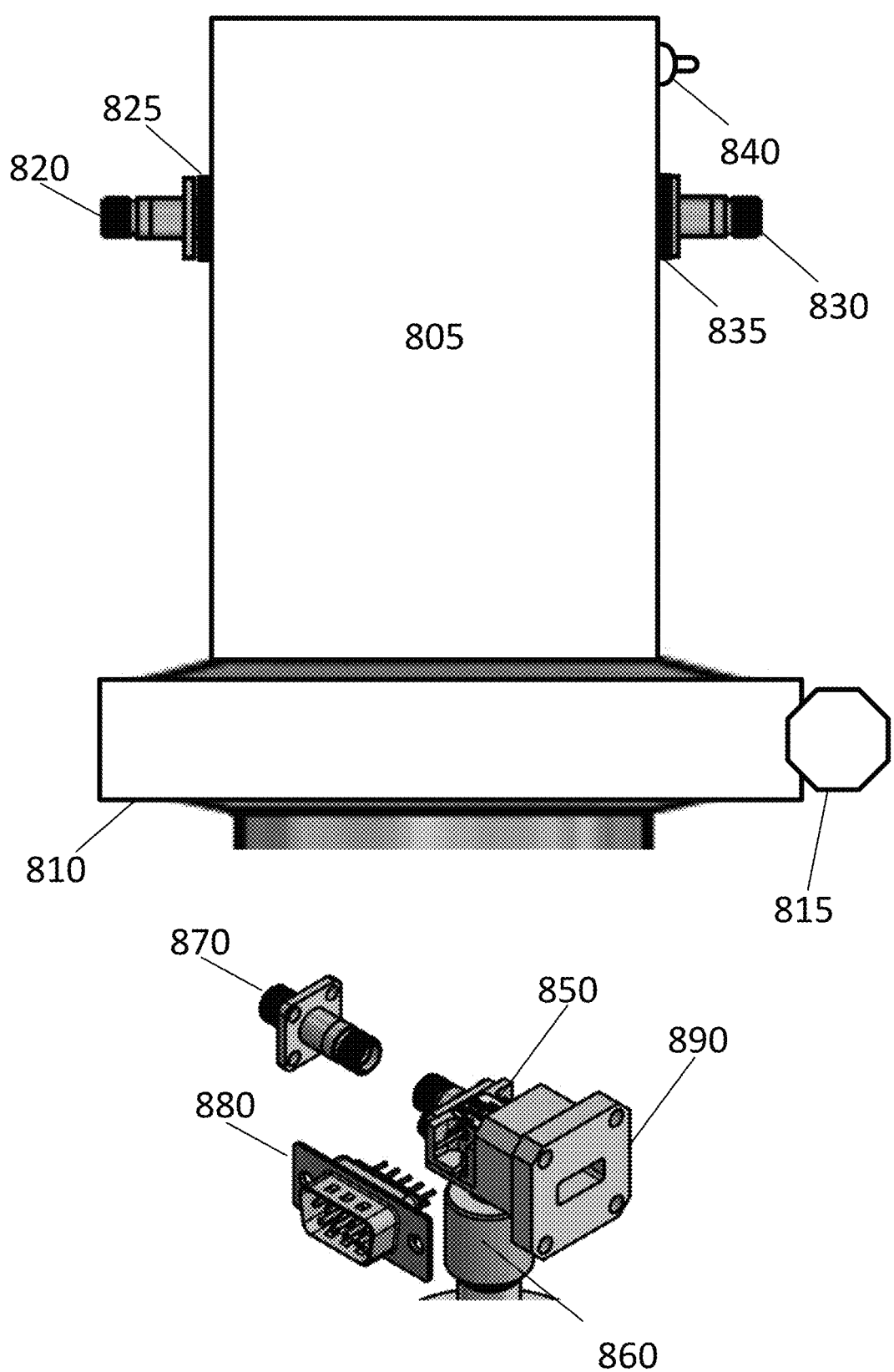
FIG. 8 illustrates a vacuum chamber attached to a cold end of a Stirling cryocooler.

FIG. 8 illustrates a vacuum chamber attached to a cold end of a Stirling cryocooler. The vacuum chamber 805 of FIG. 8 may contain the electronic assembly illustrated in FIGS. 7-6 and this assembly may be a low noise amplifier schematically illustrated in FIGS. 1-2. Clamp 810 may be tightened in place around flanges 710 & 750 of FIG. 7 using nut or screw 815. Once nut or screw 815 is tightened, clamp 810 retains surfaces of flanges 710 & 755 of FIG. 7 in a stationary position. Here again, once the parts of vacuum chamber 805 are assembled, a vacuum may be attached to a valve 840 to suck atmospheric gasses out of vacuum chamber 810. At this time, since seal 750 of FIG. 7 is positioned between flanges, that seal prevents air from leaking into the vacuum chamber 810 after the vacuum pump is removed from valve 840. This valve may be manually sealed (by turning a mechanism) or may be automatically sealed (e.g. by use of a spring loaded valve).

FIG. 8 also includes connectors 820 & 830 and seals 825 and 835. Connectors 820 & 830 maybe the same connection extenders 740 & 745 of FIG. 7 and seals 825 & 835 may prevent air from leaking into chamber 805 when that chamber is under negative pressure/vacuum. Portions of the vacuum chamber of FIGS. 7-8 may be of any shape. For example, even when flanges 755 and 710f FIG. 7 are round, chamber portion 760 could be round/cylindrical or could be rectangular in shape. In such an instance flange 755 may be welded onto a hole located at the bottom of chamber portion 760.

A number of different connectors 870, 880, & 890 are also illustrated in FIG. 8. Connector 870 may be similar to connectors 820/830 of FIG. 8 or connection extenders 740/745 of FIG. 7. Connector 880 may be a standard "D-Sub" connector used to in computer interfaces, and connector 890 may be a waveguide. Each of these connectors may be coupled to an electronica assembly 850 that is cooled by a cold part 860 of a Stirling cryocooler. These additional connectors 870, 880, & 890 illustrate the fact that virtually any electrical connector or signal connector may be integrated into a vacuum chamber of the present disclosure.

While not illustrated in the figures, portions of a vacuums chamber (e.g. portion 760 of FIG. 7) may include insulators that further isolate the internal of the vacuum chamber from the outside environment. Insulation could be added to outside surfaces of the chamber, inside surfaces of the chamber, or to both outside and inside surfaces. The vacuum itself may also act as insulation that could help prevent heat from the outside of the vacuum chamber from reaching electronic circuits contained within the vacuum chamber.

Features incorporated into the inside of a vacuum chamber may have a mass that corresponds to a thermal mass and parameters associated with a particular Stirling cryocooler may be identified. One particular parameter associated with a cryocooler may be a heat transfer parameter that may correspond to a power input to the cryocooler and an amount of heat transferred per unit time given that power input. An amount of mass coupled to the cold end of the cryocooler may be associated with heat transfer functions. Once an internal temperature of the electronic assembly reaches a desired temperature, cycling rates of the cryocooler may be slowed. The thermal mass inside of the vacuum chamber at such a time would help maintain temperatures within the cryocooler in a way that may be at least proportional to the thermal mass connected to the cold portion of the cryocooler. Even in instances when the vacuum chamber may be located in hot locations (e.g. on a cellular tower in Phoenix Arizona in the summer) internal cooled thermal mass and insulation could allow a particular cryocooler to operate at less than 100% duty cycle when a particular temperature of the electronic components was maintained within the vacuum chamber. This may be true even when a seal of the vacuum chamber leaks. As such, a method of designing of the vacuum chamber and a cryocooler could include performing calculations using equations with factors associated with one or more of: a. thermal mass connected to a cold part of a cryocooler, b. heat transfer capability vs operating frequency of the cryocooler, c. cryocooler operating frequency, d heat generated by operation of the amplifier circuits, e. insulation efficiency, f. vacuum insulation, and g. external heat inputs. The thermal mass combined with variable cooler control may allow an amplifier to operate for a period of time within acceptable limits until service personnel can repair or replace an amplifier sub-system after pressures or temperatures are no longer meet desired operating physical (pressure or temperature) specifications even when that amplifier sub-system can still meet operational electronic/electrical specifications.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claim.

What is claimed is:

1. An apparatus comprising:
   a cooled portion of the apparatus, wherein a cooling device transfers heat away from the cooled portion;
   an amplifier circuit assembly that is physically coupled to the cooled portion;
   a chamber, wherein an interior of the chamber includes the cooled portion and the amplifier circuit assembly; and
   a valve that transitions between an open state and a closed state, wherein an interior pressure in the interior of the chamber is lower than an exterior pressure at an exterior of the chamber based on operation of a vacuum pump that moves gas from the interior of the chamber to the exterior of the chamber through the valve while the valve is in the open state, wherein the interior pressure being lower than the exterior pressure is maintained while the valve is in the closed state.

2. The apparatus of claim 1, further comprising a seal that seals the chamber.

3. The apparatus of claim 1, wherein the amplifier circuit assembly includes a first field effect transistor (FET) and a second FET coupled in parallel.

4. The apparatus of claim 1, further comprising:
- an input portion of the amplifier circuit assembly that receives a signal from a signal source; and
- an output portion of the amplifier circuit assembly that outputs an amplified variant of the signal based on the amplifier circuit assembly amplifying the signal to generate the amplified variant of the signal.

5. The apparatus of claim 1, further comprising an input portion of an amplification stage of the amplifier circuit assembly that receives a signal from a signal source, the amplifier circuit assembly including a field effect transistor (FET) of the amplification stage through which the signal is passed based on:
- a first electrically coupling that couples the input portion to a first interconnect of the FET; and
- a second electrical coupling that couples a second interconnect of the FET to a first electrical conductor.

6. The apparatus of claim 5, wherein the amplification stage includes a second FET through which the signal is passed based on:
- a third electrical coupling that couples the input portion to a first interconnect of the second FET; and
- a fourth electrical coupling that couples a second interconnect of the second FET to the first electrical conductor, wherein the first electrical coupling and the second electrical coupling and the third electrical coupling and the fourth electrical coupling are used to couple coupled the FET and the second FET in parallel.

7. The apparatus of claim 5, wherein the amplifier circuit assembly includes a second amplification stage coupled to the amplification stage, wherein the second amplification stage includes at least one additional FET.

8. The apparatus of claim 6, wherein the first electrical coupling, the second electrical coupling, the third electrical coupling, and the fourth electrical coupling include respective inductors with respective inductances.

9. The apparatus of claim 8, wherein at least one of the respective inductances of the respective inductors corresponds to a dimension of a wire.

10. The apparatus of claim 1, further comprising at least one sensor that collects sensor data.

11. The apparatus of claim 10, further comprising an output interface that provides the sensor data to an external electronic circuit.

12. The apparatus of claim 10, wherein the sensor data includes at least one measurement of at least one characteristic of the interior of the chamber, wherein a corrective action is initiated to affect the at least one characteristic in response to identifying that the at least one measurement crosses a threshold relative to a previous measurement of the at least one characteristic.

13. The apparatus of claim 12, wherein the at least one characteristic of the interior of the chamber includes the interior pressure in the interior of the chamber.

14. The apparatus of claim 12, wherein the at least one characteristic of the interior of the chamber includes a temperature in the interior of the chamber.

15. The apparatus of claim 1, wherein the cooled portion of the apparatus is a portion of the cooling device.

16. The apparatus of claim 1, wherein the cooling device includes a Stirling cooler.

17. The apparatus of claim 4, wherein the amplifier circuit assembly includes at least one waveguide, wherein the at least one waveguide is coupled to at least one of the input portion or the output portion.

18. A method for packaging an amplifier circuit, the method comprising:
- transferring heat away from a cooled portion of an apparatus using a cooling device of the apparatus, wherein an amplifier circuit of the apparatus is physically coupled to the cooled portion, wherein the cooled portion and the amplifier circuit are included within an interior of a chamber of the apparatus;
- reducing an interior pressure in the interior of the chamber to be lower than an exterior pressure at an exterior of the chamber by moving gas from the interior of the chamber to the exterior of the chamber based on operation of a vacuum pump while a valve is in an open state, and
- maintaining the interior pressure being lower than the exterior pressure while the valve is in a closed state.

19. The method of claim 18, further comprising cooling the amplifier circuit based on the cooling device transferring the heat away from the cooled portion.

20. The method of claim 18, further comprising cooling the amplifier circuit to a temperature less than negative 100° C. (C) based on the cooling device transferring the heat away from the cooled portion.

21. The method of claim 18, further comprising:
- receiving sensor data sensed by at least one sensor included within the interior of the chamber, wherein the sensor data includes at least one measurement of at least one characteristic of the interior of the chamber; and
- initiating a corrective action to affect the at least one characteristic in response to identifying that that the at least one measurement crosses a threshold relative to a previous measurement of the at least one characteristic.

* * * * *